US012771356B2

(12) United States Patent
Kastrup

(10) Patent No.: US 12,771,356 B2
(45) Date of Patent: Oct. 20, 2026

(54) SENSOR CIRCUIT FOR A DEVICE PERFORMING A SAFETY FUNCTION, DEVICE AND METHOD FOR PROCESSING MEASUREMENT VALUES OF SENSORS

(71) Applicant: Abberior Instruments GmbH, Göttingen (DE)

(72) Inventor: Lars Kastrup, Gottingen (DE)

(73) Assignee: ABBERIOR INSTRUMENTS GMBH, Gottingen (DE)

( * ) Notice: Subject to any disclaimer, the term of this patent is extended or adjusted under 35 U.S.C. 154(b) by 996 days.

(21) Appl. No.: 18/070,667

(22) Filed: Nov. 29, 2022

(65) Prior Publication Data

US 2023/0195413 A1 Jun. 22, 2023

(30) Foreign Application Priority Data

Dec. 21, 2021 (DE) ..................... 10 2021 134 163.9

(51) Int. Cl.
*H03K 19/21* (2006.01)

(52) U.S. Cl.
CPC ................................... *H03K 19/21* (2013.01)

(58) Field of Classification Search
CPC ...................................................... H03K 19/21
USPC .......................................................... 307/326
See application file for complete search history.

(56) References Cited

U.S. PATENT DOCUMENTS

| | | | | |
|---|---|---|---|---|
| 4,088,900 | A | 5/1978 | Klopsch et al. | |
| 5,970,018 | A * | 10/1999 | Iwata | G11C 8/10 365/230.06 |
| 10,033,388 | B1 * | 7/2018 | Rawat | G11C 29/835 |
| 2005/0052083 | A1 | 3/2005 | Hauf | |

(Continued)

FOREIGN PATENT DOCUMENTS

| | | | |
|---|---|---|---|
| CN | 102074055 | A | 5/2011 |
| DE | 1537379 | A1 | 10/1969 |

(Continued)

OTHER PUBLICATIONS

Extended European Search Report for Application No. EP 22213866.1 dated May 16, 2023.

*Primary Examiner* — Alfonso Perez Borroto
(74) *Attorney, Agent, or Firm* — MOSER TABOADA

(57) ABSTRACT

The invention relates to a sensor circuit for a device performing a safety function, comprising at least two sensors, at least two comparison circuits, each of the comparison circuits being assigned to one of the sensors, and a linking unit for combining logic states (L=0, L=1) of comparison circuit outputs of the comparison circuits to form a circuit output signal, the sensor circuit being configured to scale the comparison circuit output value of at least a first one of the comparison circuits and to feed it back to a measurement input or a reference input of at least a second one of the comparison circuits so that, when the comparison circuit output of the first comparison circuit transitions between the logic states (L=0, L=1), the difference between the measurement signal and the reference signal of the second (Continued)

comparison circuit is reduced or the sign of the difference between the measurement signal and the reference signal of the second comparison circuit is reversed.
The invention further relates to a device comprising the sensor circuit and a method for processing measurement values from sensors.

20 Claims, 6 Drawing Sheets

(56) References Cited

U.S. PATENT DOCUMENTS

| | | | |
|---|---|---|---|
| 2009/0241014 | A1 | 9/2009 | De Mareschal et al. |
| 2011/0249368 | A1* | 10/2011 | Andersen ............. H02H 7/1227 361/23 |
| 2014/0055887 | A1* | 2/2014 | Uryu .................... B62D 5/0484 361/18 |
| 2016/0019126 | A1* | 1/2016 | Kwon ................. G06F 11/1695 714/11 |
| 2017/0358337 | A1* | 12/2017 | Kim .................... G06F 11/1044 |
| 2020/0195186 | A1* | 6/2020 | Hirakata ................. H02P 27/06 |
| 2021/0051496 | A1 | 2/2021 | Nagaraja et al. |

FOREIGN PATENT DOCUMENTS

| | | | |
|---|---|---|---|
| DE | 4315298 | C1 | 8/1994 |
| DE | 10330202 | A1 | 7/2004 |
| DE | 102013108532 | A1 | 2/2015 |
| EP | 0164118 | B1 | 5/1991 |

* cited by examiner

SENSOR CIRCUIT FOR A DEVICE PERFORMING A SAFETY FUNCTION, DEVICE AND METHOD FOR PROCESSING MEASUREMENT VALUES OF SENSORS

CROSS-REFERENCE TO RELATED APPLICATIONS

The present application claims the benefit and priority to DE Patent Application Serial No. 10 2021 134 163.9 filed Dec. 21, 2021, the entire contents of which is incorporated herein by reference.

TECHNICAL FIELD OF THE INVENTION

The invention relates to a sensor circuit for a device performing a safety function, a corresponding device and a method for processing measurement values from sensors.

In the context of the present application, safety functions are those functions which are designed to protect persons from injury or other damage to health caused by a wide range of technical equipment, or to prevent further damage to equipment, buildings, etc.

From the prior art, sensor systems are known that monitor the status of devices performing safety functions. These can, e.g., detect states in which the device performs its safety function only inadequately or no longer at all. By coupling the sensor with safety circuits, an emergency shutdown can then be brought about, e.g., when an unsafe condition is detected.

For example, machines that have electrically, pneumatically or hydraulically driven elements may have a cover or housing to particularly protect operators of the machine from injury.

Safety-related covers and housings are also known, e.g., for optical devices that contain high-power lasers. In this case, the cover ensures laser safety by protecting operators and other persons present from eye damage caused by the laser light.

However, in order to be able to perform maintenance work, e.g., such covers are often equipped with an opening mechanism.

To ensure that an unforeseen opening of the cover does not pose a danger, sensor systems (e.g. mechanically or magnetically triggered switches or Hall sensors triggered by magnets) can control the opening state of the cover and cause a transition to a safe state (e.g. an emergency shutdown or a transition to a standby state) in the open state.

Furthermore, in optical devices such as light microscopes, which use laser sources in particular, there is the problem that during a necessary mechanical adjustment of optical elements such as mirrors or filter arrangements in the beam path, reflections of the laser light can enter the eyepiece. This can lead to eye damage for the user. For this reason, safety sensors are known, e.g., which detect certain safety-critical arrangements of the optical elements in the beam path and then prevent light reflections from occurring in the eyepiece, for example by darkening the eyepiece or selectively interrupting or redirecting the laser light at a suitable position.

To further increase safety even in the event of malfunctions of the safety system, for example, the standard DIN EN 61508-2:2010 stipulates that systems performing safety functions must be designed redundantly. For this purpose, e.g., at least two sensors may be provided, which monitor the same safety function. The at least two sensors can record the same physical measured variable or different physical measured variables, which can be used to make a statement about the status of the safety system.

Furthermore, it is known from the prior art to couple such redundant sensors antivalently (e.g. via antivalent data lines) with a monitoring circuit. Here, “antivalent” means that the signal levels of the output signals of the sensors differ from each other when the system performing the safety functions is in the same state. For example, a first sensor may produce a low electrical voltage (LO) output signal when the cover is closed and a high voltage (HI) output signal when the cover is open, while a second sensor may produce a high voltage (HI) output signal when the cover is closed and a low voltage (LO) signal when the cover is open.

Such a monitoring system has the advantage of having defined permitted states, namely those in which the sensor output signals have a different signal level (HI/LO or LO/HI), while states with two identical signal levels (LO/LO or HI/HI) are not permitted and are interpreted as errors. As a result of impermissible states, the monitoring circuit can then automatically initiate an emergency shutdown of the system or the transition to a safe state, for example.

Safety-relevant systems with redundant sensors have the disadvantage that short-term impermissible states (states of the same signal level of both sensors) often result from the fact that the sensors do not trigger simultaneously when their measured variable changes. As a result, unnecessary emergency shutdowns or transitions to safe states are brought about, for example, even though there is no safety-relevant problem at all.

PRIOR ART

U.S. Pat. No. 4,088,900 discloses a circuitry for evaluating safety-related signals in the control of an elevator. The circuitry comprises a circuit, a monitoring circuit and a test circuit, which are coupled to each other via diodes. The three sub-circuits each have two different digital logic units. The two logic units of the circuit receive antivalent signals from two sensors that monitor the state of the elevators door. The monitoring circuit and the test circuit can detect different fault conditions and then block the elevator motor from starting. A delay circuit is provided to prevent the system from being switched off if the sensor signals are equivalent for only a short time.

US patent application 2005/0052083 A1 describes a method for detecting faulty antivalent key or switching signals and a corresponding circuit for carrying out the method. According to the embodiment shown, the antivalent signal outputs are routed in an evaluation unit in two parallel branches to logical AND gates, with an inverter element being arranged in one of the branches so that an error signal is generated in the event of faulty equivalent states of the two signal outputs. A delay circuit ensures that short-time equivalent states do not result in an error signal.

In one variant of the method, a further delay circuit can be used to detect whether the key or switch signal is present for too long a duration, an error that can result, example. g., from the blocking of an input key. Furthermore, the patent application discloses the use of the method in various production machines.

A circuit arrangement for generating two mutually complementary signals is known from patent specification DE 43 15 298 C1, in which a signal and a signal inverted thereto are each applied to a transfer transistor controlled by a clock, each transfer transistor controlling an inverter on the output side, and the inverters being fed back crosswise. This makes it possible to improve the agreement of the timing behavior of the antivalent signals.

The European patent specification EP 0 164 118 B1 describes a circuit for evaluating the signal of a Hall sensor with antivalent output signals, which monitors the state of a DC motor for a computer hard disk. The circuit comprises a commutation comparator and an index comparator, wherein according to one embodiment the output of the commutation comparator is dynamically coupled to an input of the index comparator so that a positive edge of the output signal is coordinated with a zero crossing of the sensor signal with high accuracy.

The solutions described in the prior art are directed at better temporal coordination of the antivalent signals themselves (e.g., by delay circuits) and thus have the disadvantage that, if synchronization is not perfect, short-term signal equivalence can still occur in certain situations and thus undesirable error conditions can occur.

Objective of the Invention

The present invention has the objective of providing a sensor circuit for a device performing a safety function with redundant sensors, in which principle-related transient fault conditions occur less frequently, which improves the user-friendliness and fail-safety of the sensor circuit or device.

Solution

This objective is attained by the sensor circuit according to claim 1, the device according to claim 15, the light microscope according to claim 18, and the method according to claim 19. Advantageous further embodiments of the sensor circuit are the subject of subclaims 2 to 14 and advantageous further embodiments of the device are the subject of subclaims 16 and 17. Further advantageous embodiments of the invention are described below.

DESCRIPTION OF THE INVENTION

A first aspect of the invention relates to a sensor circuit for a device performing a safety function.

The sensor circuit comprises at least two sensors, each of the sensors being configured to detect a respective measured variable and to generate a measurement signal comprising a measurement value that is monotonically dependent on the respective measured variable.

"Monotonically dependent" in this context means that the measurement signal remains the same or increases when the measured variable increases (monotonically increasing) or that the measurement signal remains the same or decreases when the measured variable decreases (monotonically decreasing). In particular, the measurement value is strictly monotonically dependent on the respective measured variable. This means that the measurement signal always increases when the measured variable increases and always decreases when the measured variable decreases. The sensors can measure the same measured variable or different measured variables, e.g., to increase the redundancy of the measurement. In particular, the sensors output an analog measurement signal.

Furthermore, the sensor circuit comprises at least two comparison circuits, each of the comparison circuits being assigned to one of the sensors, and each of the comparison circuits comprising a measurement input for receiving the measurement signal of the respective assigned sensor, a reference input for receiving a reference signal to define a trigger threshold value of the comparison circuit, and a comparison circuit output.

The comparison circuit output can assume a first logic state and a second logic state, wherein the states can be represented, e.g., by the parameters L=0 and L=1. The comparison circuit output is configured to generate an analog or digital comparison circuit output signal comprising a comparison circuit output value representing one of the logic states. The trigger threshold value may be predetermined or presettable, i.e., variable, and influences the measurement value received at the measurement input at which the respective comparison circuit switches to another logic state.

In particular, the comparison circuits are configured to compare a signal level of the respective received measurement signal with a signal level of the respective received reference signal and to determine the logic state of the comparison circuit output and thus the generated comparison circuit output signal on the basis of the comparison. For example, a comparison circuit according to the invention could change from the state L=0 to the state L=1 if the measurement signal has a higher signal level than the reference signal.

The comparison circuits may be designed as comparators, particularly in an analog implementation of the safety circuit. Such comparators may be implemented, e.g., by measurement amplifiers with two inputs and a comparator output, wherein the comparator output value at the comparator output represents a comparison of the input signal levels applied to the two inputs. Typically, one of the inputs is inverting and the other input is non-inverting.

Alternatively, the comparison circuit may also be formed, e.g., by a subtraction element or a subtractor, especially in a digital implementation of the sensor circuit according to the invention. Such subtractors also have two inputs and one output and form the difference of the two input signals. Depending on whether the calculated difference is greater than or less than zero, the output level or output value of the subtractor is then determined. E.g., a digital subtractor may output an output value of 0 when the difference of the input values is less than zero and output an output value of 1 when the difference of the input values is greater than zero.

The sensor circuit also comprises a linking unit which is configured to combine the logic states of the comparison circuit outputs of the at least two comparison circuits by means of a logic AND operation to form a circuit output signal of the sensor circuit. The circuit output signal represents in particular two alternative logic states which represent an AND operation of the logic states of the comparison circuit outputs.

The linking unit thus compares the comparison circuit output signals of two comparison circuits and outputs a circuit output signal representing the L=1 logic state when the comparison circuit output signals of both comparison circuits represent the L=1 logic state.

According to the invention, the sensor circuit is configured to scale the comparison circuit output value of at least a first one of the comparison circuits and to feed it back to the measurement input or the reference input of at least a second one of the comparison circuits, so that when the comparison circuit output of the first comparison circuit transitions between the logic states (i.e. in particular during the transition from the state L=0 to the state L=1 and/or during the transition from the state L=1 to the state L=0) the difference between the measurement signal and the reference signal of the second comparison circuit is reduced or the sign of the difference between the measurement signal and the reference signal of the second comparison circuit is reversed.

In this way, the switching behavior of the at least two sensors is coordinated in time so that brief fault states of the system are avoided. This means that in many cases unnecessary emergency shutdowns or transitions to a safe state can be avoided, which improves the reliability of the safety device.

The temporal coordination is achieved by the fact that when a sensor subsystem (first sensor and comparison circuit) is switched to another logic state caused by the change in the measured variable, the sensitivity of the other sensor subsystem (second sensor and comparison circuit) is increased in a targeted manner. Due to the scaling of the feedback signal, the second sensor subsystem is not simply activated automatically, but remains to a large extent dependent on the sensed measured variable. As a result, the independence of the sensor channels is maintained despite the time coordination and real fault conditions are still detected as such.

If the measurement value detected by the second sensor is already just below the trigger threshold value when the first comparison circuit is triggered, the sign of the difference between the measurement value and the reference value of the second comparison circuit may be reversed due to the feedback of the scaled output signal of the first comparison circuit. In this case, the second comparison circuit also immediately changes to the other logic state. Otherwise, only the difference between the measurement value and the reference value is reduced, so that the second comparison circuit triggers more quickly in the event of a further change in the measured variable than without the feedback.

Scaling of the comparison circuit output value is performed in particular by a driver of the sensor circuit with a gain factor not equal to one, which assumes the function of a scaler. The driver is connected to the measurement input or the reference input of the second comparison circuit in order to feed back the scaled comparison circuit output value to it.

According to one embodiment, the sensor circuit is configured to scale the comparison circuit output value of the second comparison circuit and to feed it back to the measurement input or the reference input of the first comparison circuit, so that when the comparison circuit output of the second comparison circuit transitions between logic states, the difference between the measurement signal and the reference signal of the first comparison circuit is reduced or the sign of the difference between the measurement signal and the reference signal of the first comparison circuit is reversed. In other words, crosswise feedback is implemented as positive feedback between the comparison circuits according to this embodiment.

According to one embodiment, the sensor circuit, in particular the driver or scaler, is configured to scale the comparison circuit output value of the first comparison circuit (or the second comparison circuit) with a factor of $<0.5$, in particular of $<0.2$, further in particular of $<0.1$. The lower the scaling factor is, the more the respective other comparison circuit remains dependent on the sensed measured variable of the sensor assigned to it, so that the independence of the sensor channels is further improved. In a specific case, the value of the scaling factor could be adjusted to achieve an optimum between the temporal coordination and the independence of the sensors.

According to a further embodiment, the sensor circuit is configured to generate the reference signal of one of the comparison circuits, in particular the second comparison circuit, by a weighted sum of the trigger threshold value of this comparison circuit, in particular the second comparison circuit, and the comparison circuit output value, weighted by a weighting factor, of another one of the comparison circuits, in particular the first comparison circuit, and optionally the comparison circuit output value, weighted by a weighting factor, of at least a further one of the comparison circuits. That means in particular, the reference signal $r_j$ of the comparison circuit with the index j is determined by the sum $r_j = a_j + g_{ij} Y_i$ wherein $a_j$ denotes the trigger threshold value of the comparison circuit j, $g_{ij}$ denotes the weighting factor and $Y_i$ denotes the comparison circuit output signal of the comparison circuit with the index i.

Alternatively or additionally, the sensor circuit may be configured to generate the measurement signal of one of the comparison circuits, in particular the second comparison circuit, by a weighted sum of the measurement signal of the sensor assigned to this comparison circuit, in particular the second comparison circuit, and the comparison circuit output value of another one of the comparison circuits, in particular the first comparison circuit, weighted by a weighting factor, and optionally the comparison circuit output value of at least a further one of the comparison circuits, weighted by a weighting factor. That means in particular, the measurement signal of the comparison circuit with the index j is determined by the sum $m_j = a_j + g'_{ij} Y_i$ wherein $a_j$ denotes the trigger threshold value of the comparison circuit j, $g'_{ij}$ denotes the weighting factor and $Y_i$ denotes the comparison circuit output signal of the comparison circuit with the index i.

The weighting factors may be represented by a matrix $g_{ij}$ (in case of feedback to the reference input of the respective comparison circuit) or $g'_{ij}$ (in case of feedback to the measurement input of the respective comparison circuit). The index i denotes the comparison circuit whose comparison circuit output value is scaled and fed back and the index j denotes the comparison circuit whose reference signal or measurement signal is generated by means of the weighted sum. The formation of the weighted sums may be performed, in particular, by summers of the sensor circuit. In particular the main diagonal of the matrix $g_{ij}$ has exclusively values of zero, i.e., the comparison circuit outputs are not fed back to themselves.

According to a further embodiment, the weighting factor used in generating the reference signal from the weighted sum is less than or equal to zero or the weighting factor used in generating the measurement signal by the weighted sum is greater than or equal to zero, if the comparison circuit output value of the first comparison circuit is smaller in the first logic state (L=0) than in the second logic state (L=1) and the measurement value of the sensor assigned to the second comparison circuit increases monotonically as a function of the measured variable, or if the comparison circuit output value of the first comparison circuit is larger in the first logic state (L=0) than in the second logic state (L=1) and the measurement value of the sensor assigned to the second comparison circuit decreases monotonically as a function of the measured variable.

According to a further embodiment, the weighting factor used in generating the reference signal from the weighted sum is greater than or equal to zero or the weighting factor used in generating the measurement signal by the weighted sum is less than or equal to zero, if the comparison circuit output value of the first comparison circuit is greater in the first logic state (L=0) than in the second logic state (L=1) and the measurement value of the sensor assigned to the second comparison circuit increases monotonically as a function of the measured variable, or if the comparison circuit output value of the first comparison circuit is smaller in the first logic state (L=0) than in the second logic state (L=1) and the measurement value of the sensor assigned to the second comparison circuit decreases monotonically as a function of the measured variable.

In particular, these relationships can also be summarized in the following manner, wherein $g_{ii}$ denotes the matrix of the weighting factors when feeding back the comparison circuit output signal of the i-th comparison circuit to the reference input of the j-th comparison circuit, $g'_{ij}$ denotes the matrix of weighting factors in the case of feedback of the comparison circuit output signal of the i-th comparison circuit to the measurement input of the j-th comparison circuit, Y(L=0) denotes the comparison circuit output value in the first logic state, Y(L=1) denotes the comparison circuit output value in the second logic state, and y(x) denotes the function of the measurement value of the respective sensor from the measured variable x:

$$\begin{cases} g_{ij} \leq 0, g'_{ij} \geq 0 \text{ when } Y(L=0) < Y(L=1) \text{ and } y(x) \text{ monotonically increasing} \\ g_{ij} \leq 0, g'_{ij} \geq 0 \text{ when } Y(L=0) > Y(L=1) \text{ and } y(x) \text{ monotonically decreasing} \\ g_{ij} \geq 0, g'_{ij} \leq 0 \text{ when } Y(L=0) > Y(L=1) \text{ and } y(x) \text{ monotonically increasing} \\ g_{ij} \geq 0, g'_{ij} \leq 0 \text{ when } Y(L=0) < Y(L=1) \text{ and } y(x) \text{ monotonically decreasing} \end{cases}$$

According to a further embodiment, the first logic state and the second logic state are represented by electrical signal levels, in particular by TTL, LVTTL, CMOS, ECL, PECL, LVECL, LVPECL or LVDS signal levels.

According to a further embodiment, logically identical logic states of the comparison circuit outputs of different ones of the comparison circuits are represented by different, in particular complementary, electrical signal levels.

According to a further embodiment, the first logic state and the second logic state are represented by optical signal states, in particular by intensity, wavelength or polarization states.

According to a further embodiment, logically identical logic states of the comparison circuit outputs of different ones of the comparison circuits are represented by different, in particular complementary, optical signal states.

According to a further embodiment, the measurement values are represented by analog voltage or current values.

According to a further embodiment, the measurement values are represented by numbers in a binary representation.

According to another embodiment, the measured variables are independently selected from the group consisting of: mechanical displacement, mechanical force, pressure, light intensity, polarization, temperature, loudness, capacitance, inductance, magnetic flux, electric voltage, electric current, or electric field strength. In other words, each of the at least two sensors, according to this embodiment, is capable of sensing one of said measured variables independently of the other sensor or sensors. Thus, any combination of said measured variables is possible for the at least two sensors according to this embodiment. In this embodiment, the avoidance of systematic failures by using diversified components and measuring principles is taken into account in a special way.

According to another embodiment, the sensors are independently selected from the group consisting of Hall sensors, photodiodes, phototransistors, photoresistors, thermocouples, capacitive or inductive distance sensors, strain gauges, microphones, adjustable resistors, adjustable capacitors, adjustable inductors. That is, each of at least two sensors may correspond to one of the above types independently of all other sensors.

According to a further embodiment, the sensors are configured to detect different measured variables.

According to a further embodiment, the sensors are configured to detect the same measured variable, but are based on different measuring principles or belong to different sensor types.

Both of the latter embodiments improve the redundancy of the sensor circuit.

According to a further embodiment, the sensor circuit comprises an error detection unit, wherein the error detection unit is configured to combine the logic states of the comparison circuit outputs by means of a logic exclusive OR operation to form an error signal of the sensor circuit. The error detection unit may advantageously detect error states in which the comparison circuit output signals represent different logic states.

A second aspect of the invention relates to a device for performing a safety function comprising a sensor circuit according to the first aspect of the invention.

According to one embodiment, the device is a machine comprising a shielding element for protecting against contact of electrically, pneumatically or hydraulically driven elements, wherein the sensor circuit is configured to monitor a state of the shielding element. In particular, the shielding element is configured to be movable, wherein the shielding element comprises at least a first state in which the driven elements are accessible from the outside and a second state in which the driven elements are covered by the shielding element for protection against contact. The shielding element may be, e.g., a removable, pivoting or sliding cover, a lockable door, flap or hatch in a housing of the machine or the like. Suitable sensors for monitoring the state may be, e.g., magnetic sensors combined with permanent or electromagnets, e.g., Hall sensors. Alternatively, optical sensors such as photodiodes, transistors or resistors can be used in combination with a light source (e.g., an LED). In this case, the light source may, e.g., be arranged relative to the optical sensor in such a way that in a first state of the shielding element, light from the light source falls on the sensor, while in a second state no or less light reaches the sensor. Alternatively, mechanical displacement sensors such as, e.g., linear potentiometers can be used.

Another possible sensor principle is the change in capacitance of conductive surfaces that are displaced relative to one another. In such capacitive sensors, e.g., a capacitor may be formed from a tubular electrode and a rod-shaped electrode. One of the electrodes may be connected to the shielding element and the other electrode may be connected, e.g., to the housing of the device. If the rod-shaped electrode dips into the tubular electrode when the shielding element is displaced relative to the housing, the state of the shielding element can thus be sensed.

According to another embodiment, the device is a laser device, wherein the laser device comprises a laser of laser class 3, 3B, 3R, or 4.

According to a further embodiment, the device further comprises a shielding element for protection against laser radiation escaping from the laser device, wherein the sensor circuit is configured to monitor a state of the shielding element. In particular, the shielding element is configured to be movable, wherein the shielding element comprises at least a first state in which laser radiation can escape and a second state in which the shielding element prevents the laser radiation from escaping. The shielding element may again be, e.g., a removable, pivotable or slidable cover, a closable door, flap or hatch in a housing of the laser device, or the like. Sensors for monitoring the state may also be, e.g., magnetic sensors combined with permanent or electromagnets, e.g. Hall sensors, optical sensors, mechanical displacement transducers and capacitive sensors (see above).

According to a further embodiment, the device comprises an optical element that can be moved into various adjustment positions, wherein the sensor circuit is configured to monitor a state of the optical element. Here, the state of the optical element is in particular an arrangement of the optical element in a beam path of the laser device.

According to one embodiment, the laser device further comprises an eyepiece for viewing objects illuminated by means of the laser radiation, wherein the sensor circuit is designed to detect states of the movable optical element in which reflections of the laser radiation can enter the eyepiece. The movable optical element may be, e.g., a movable or rotatable mirror or a movable filter arrangement such as a filter wheel for the selective arrangement of various optical filters in a beam path. Possible sensors here are, e.g., light sensors such as photodiodes or magnetic sensors such as Hall sensors, which may be arranged at a suitable position on the movable optical element, for example.

A third aspect relates to a light microscope comprising a sensor circuit according to the first aspect of the invention and/or a device according to the second aspect of the invention, in particular comprising the laser device described above.

In particular, the light microscope comprises at least one pulsed or continuous laser for illuminating a sample with laser light. The laser light can be used, e.g., to excite emitters, such as fluorophores, in the sample to emit light (in particular fluorescence light). Furthermore, the sample may be illuminated with further laser light for switching off or depleting the emission of the emitters in certain sample areas, as known for example from so-called STED and RESOLFT microscopy.

The light microscope further comprises an objective for focusing the laser light. In particular, a focus of the laser light may be generated in the sample. This focus may be moved over, or through, the sample by means of a scanner. The light emitted by the emitters may pass (e.g., through the same objective) to a detector, in particular via a confocal pinhole, as is common in confocal laser scanning microscopy. As an alternative to scanning the laser light across the sample, wide-field illumination of the sample with the laser light is also possible. In this case, the emitted light is often detected by a camera. The light microscope may further include optical filters, beam shaping means such as phase modulators and the like.

A fourth aspect of the invention relates to a method for processing measurement values from sensors for a device performing a safety function, in particular by means of the sensor circuit according to the first aspect of the invention. The method comprises the following steps, which may be carried out not necessarily one after the other, but also possibly in a modified order, simultaneously or overlapping in time:

- detecting a respective measured variable and generating a respective measurement signal comprising a measurement value which is monotonically dependent on the respective measured variable by means of at least two sensors,
- receiving the measurement signals by respective measurement inputs of at least two comparison circuits, each of the comparison circuits being associated with one of the sensors,
- receiving reference signals for setting a trigger threshold value by respective reference inputs of the comparison circuits,
- outputting comparison circuit output signals by respective comparison circuit outputs of the comparison circuits, wherein the respective comparison circuit outputs each are capable of assuming a first logic state and a second logic state, and wherein the comparison circuit output signals each comprise a comparison circuit output value representing one of the logic states,
- combining the logic states to a circuit output signal by means of a logical AND operation, and
- scaling the comparison circuit output value of at least a first one of the comparison circuits and feeding back the scaled comparison circuit output value to the measurement input or the reference input of at least a second one of the comparison circuits, such that when the comparison circuit output of the first comparison circuit transitions between the first logic state and the second logic state, the difference between the measurement signal and the reference signal of the second comparison circuit is reduced or the sign of the difference between the measurement signal and the reference signal of the second comparison circuit is reversed.

Advantageous further embodiments of the invention result from the claims, the description and the drawings and the associated explanations to the drawings. The described advantages of features and/or combinations of features of the invention are merely exemplary and may have an alternative or cumulative effect. With regard to the disclosure content (but not the scope of protection) of the original application documents and the patent, the following applies: Further features can be found in the drawings—in particular the relative arrangements and effective connections shown.

The combination of features of different embodiments of the invention or of features of different claims is also possible in deviation from the selected back relationships of the patent claims and is hereby suggested. This also applies to such features which are shown in separate drawings or are mentioned in the description thereof. These features may also be combined with features of different claims. Likewise, features listed in the claims may be omitted for further embodiments of the invention, but this does not apply to the independent claims of the issued patent.

The reference signs contained in the patent claims do not represent a limitation of the scope of the objects protected by the claims. They merely serve the purpose of making the patent claims easier to understand.

DESCRIPTION OF THE FIGURES

Figure 1:
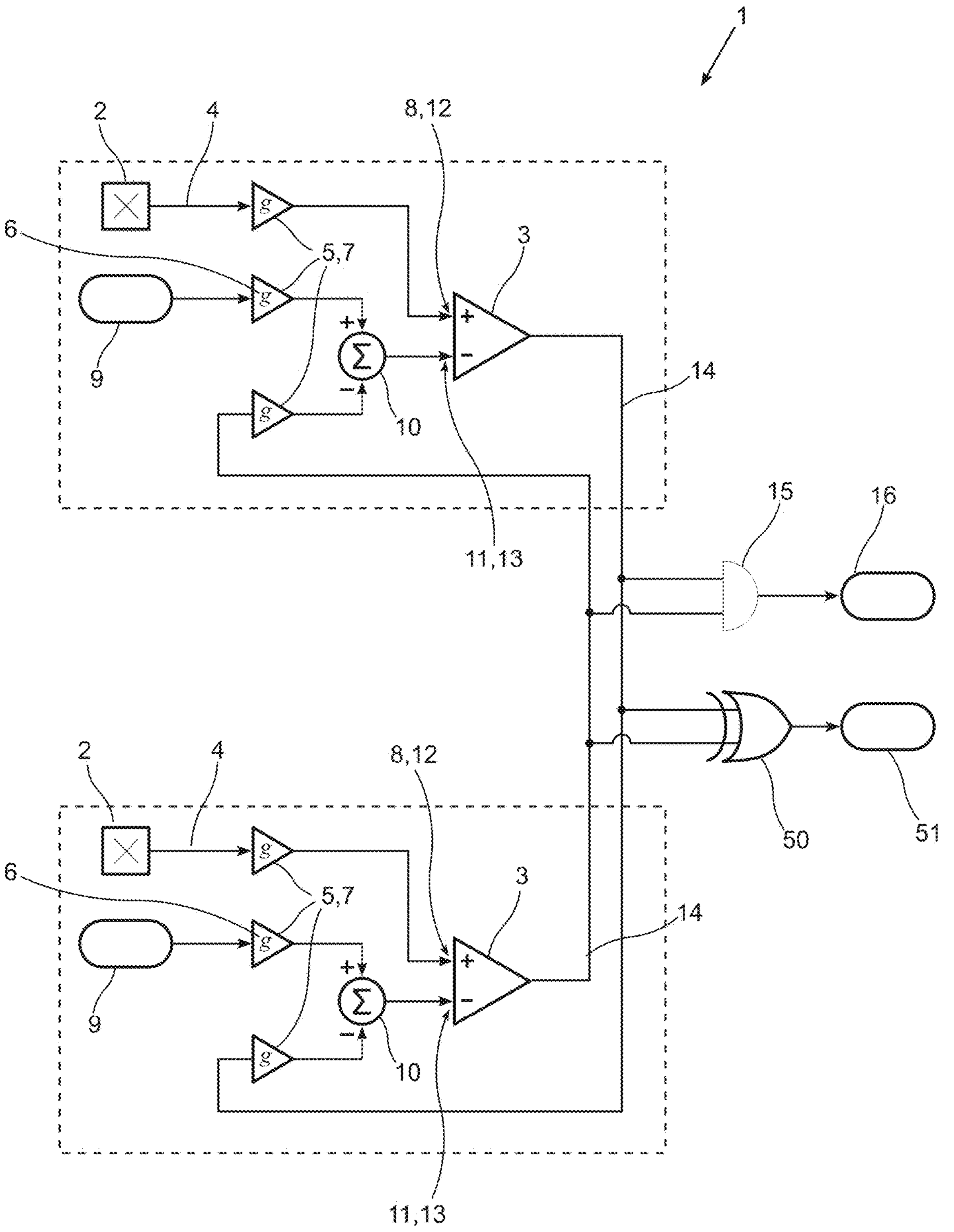
FIG. 1 shows a block diagram of a sensor circuit according to the invention.

FIG. 1 shows a sensor circuit 1 according to the invention as a block diagram. The embodiment shown comprises two sensors 2, each with an associated comparison circuit 3. According to this example, the comparison circuits 3 are designed as comparators. The measurement values 4 of the sensors 2 are fed to the measurement value inputs 8 of the comparison circuits 3 via drivers 5, which also assume the function of a scaler 7 when the amplification factor 6 is not equal to one.

In the embodiment shown, the measurement value 4 of the sensors 2 is proportional to the value of the respective measured variable, i.e., the measurement value y(x) 4 increases monotonically as a function of the measured variable x. For each comparison circuit 3, the switching points of the comparison circuits 3 are specified by individually adjustable or preset trigger threshold values 9, which are fed to the reference value inputs 11 of the comparison circuits 3 via a respective summator 10.

The measurement inputs 8 of the comparison circuits 3 are non-inverting inputs 12, whereas the reference inputs 11 are inverting inputs 13, so that the comparison circuit output values 14 of the comparison circuits 3 assume logical “1” values, when the level present at the measurement input 8 of the respective comparison circuit 3 is greater than the level present at the reference input 11 of the respective comparison circuit 3, and a logical “0” value when the level present at the measurement input 8 is less than the level present at the reference input 11.

The comparison circuit output value 14 of each comparison circuit 3 is individually scaled by a scaler 7 and fed back to the reference value inputs 11 of the respective other comparison circuit 3 via the summers 10. In this way, the switching of a comparison circuit 3 between the logic states leads to a change in the sensitivity of the other comparison circuit 3. The switching processes of the two redundant sensor channels are thus synchronized in time and transient error states, which are based on a delay in the switching behavior of one sensor channel relative to the other sensor Zo channel, occur with a lower frequency or for a shorter time.

The logic states of the comparison circuit outputs 14 are combined in the linking unit 15 with a logic AND operation, and the linking unit 15 outputs a sensor output value 16 representing the logic state obtained by the AND operation.

Optionally, the sensor circuit may further comprise an error detection unit 50 which links the comparison circuit output signals of the comparison circuit outputs 14 by an exclusive OR operation and outputs a corresponding error signal 51 representing the logic state L=1 when the two comparison circuit output signals represent different logic states. In this way, error states can be detected.

Figure 2:
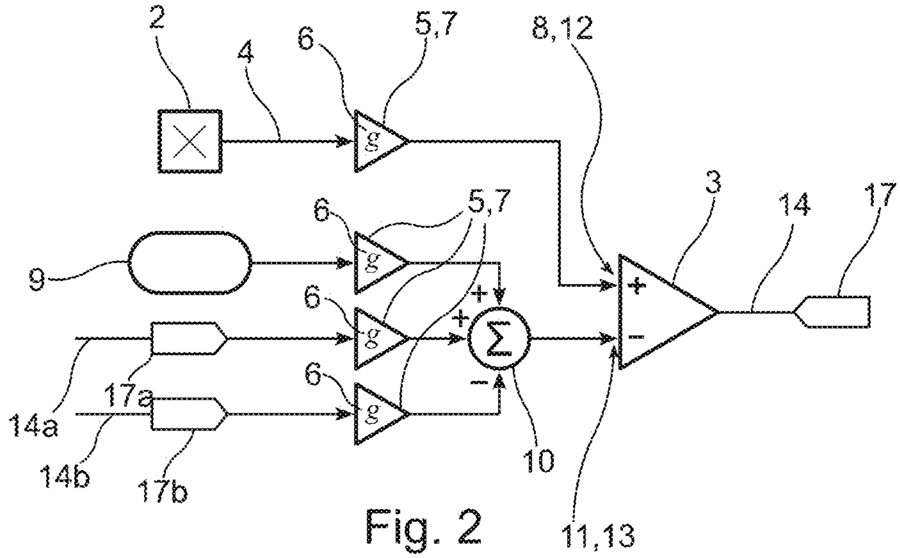
FIG. 2 shows a sensor unit with an alternative wiring of the comparison circuits.
Figure 3:
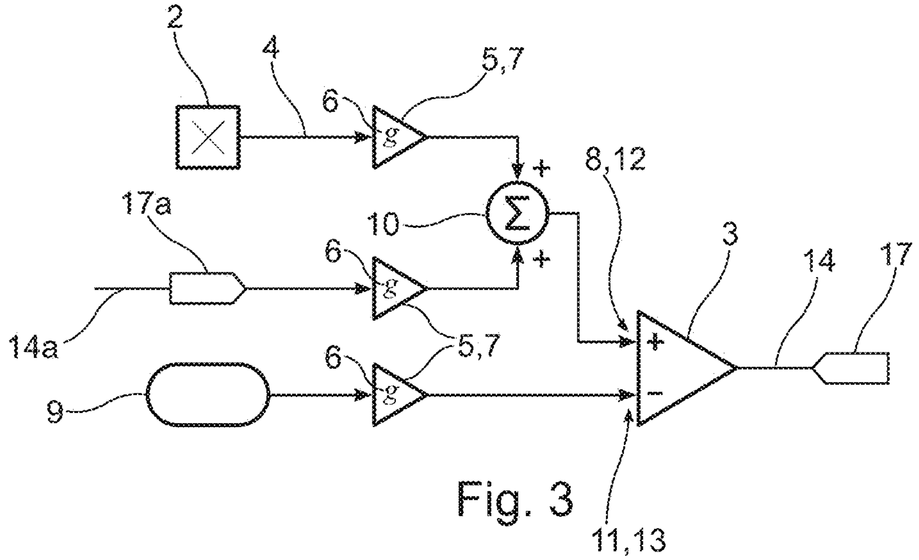
FIG. 3 shows a sensor unit with a further alternative wiring of the comparison circuits.
Figure 4:
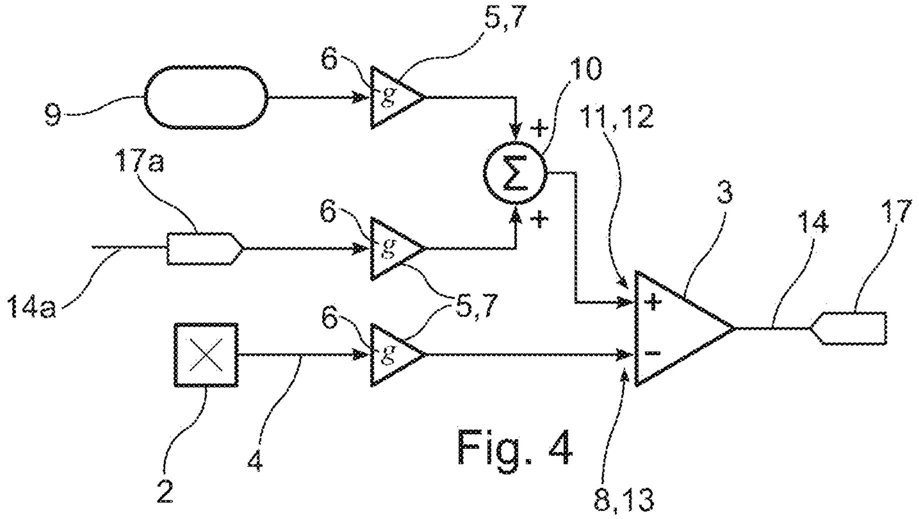
FIG. 4 shows a sensor unit with a further alternative wiring of the comparison circuits.

FIGS. 2 to 4 each show part of a sensor circuit 1 according to further embodiments of the present invention, comprising a sensor 2, a comparison circuit 3 (which is also designed here as a comparator), a summer 10 and several drivers 5 which perform the function of a scaler 7.

The embodiment shown in FIG. 2 differs from the embodiment shown in FIG. 1 and described above in that two comparison circuit outputs 14*a*, 14*b* of comparison circuits 3 not shown in FIG. 2 are scaled and fed back to the inverting reference input 11, 13 via the summer 10.

Here, one of the comparison circuit outputs 14*a* is connected to an adding input (+), the other comparison circuit output 14*b* is connected to a subtracting input (−) of the summer 10. A further adding input (+) of the summer 10 receives the trigger threshold value 9, which may have been scaled via a further driver/scaler 5,7. Thus, the summing circuit 10 calculates the sum of the scaled trigger threshold value and the scaled first comparison circuit output value minus the scaled second comparison circuit output value.

FIG. 3 shows an embodiment in which the signal of the comparison circuit output 14*a* of one comparison circuit 3 (not shown) is fed back to the measurement input 8 of the other comparison circuit 3. In this case, the comparison circuit output value 17*a* and the measurement value 4 of the sensor 2 are scaled by respective weighting factors by means of respective drivers 5, which are configured as scalers 7, and added by means of the summer 10.

The added signal is then fed to the measurement value input 8 of the comparison circuit 3, which is configured as a non-inverting input 12. The trigger threshold value 9 scaled by means of a further driver 5/scaler 7 is fed to the reference input 11.

Thus, the comparison circuit output 14 changes to the logic state L=1 when the sum between the measurement value 4 and the scaled fed-back comparison circuit output value 17*a* is greater than the trigger threshold value 9.

FIG. 4 shows an embodiment in which the trigger threshold value 9 and the comparison circuit output value 17*a* of the comparison circuit output 14*a* (from the comparison circuit 3 not shown here) are scaled via respective drivers 5/scalers 7, summed by means of the summer 10, and supplied to the reference input 11 of the comparison circuit 3, which is designed as a non-inverting input 12.

The measurement value 4 measured by means of the sensor 2 is scaled via a further driver 5/scaler 7 and reaches the measurement input 8 of the comparison circuit 3, which is designed here as an inverting input 13. Therefore, the comparison circuit output 14 changes to the logic state L=1 when the sum of the scaled trigger threshold value 9 and the scaled comparison circuit output value 17*a* exceeds the scaled measurement value 4.

Figure 5:
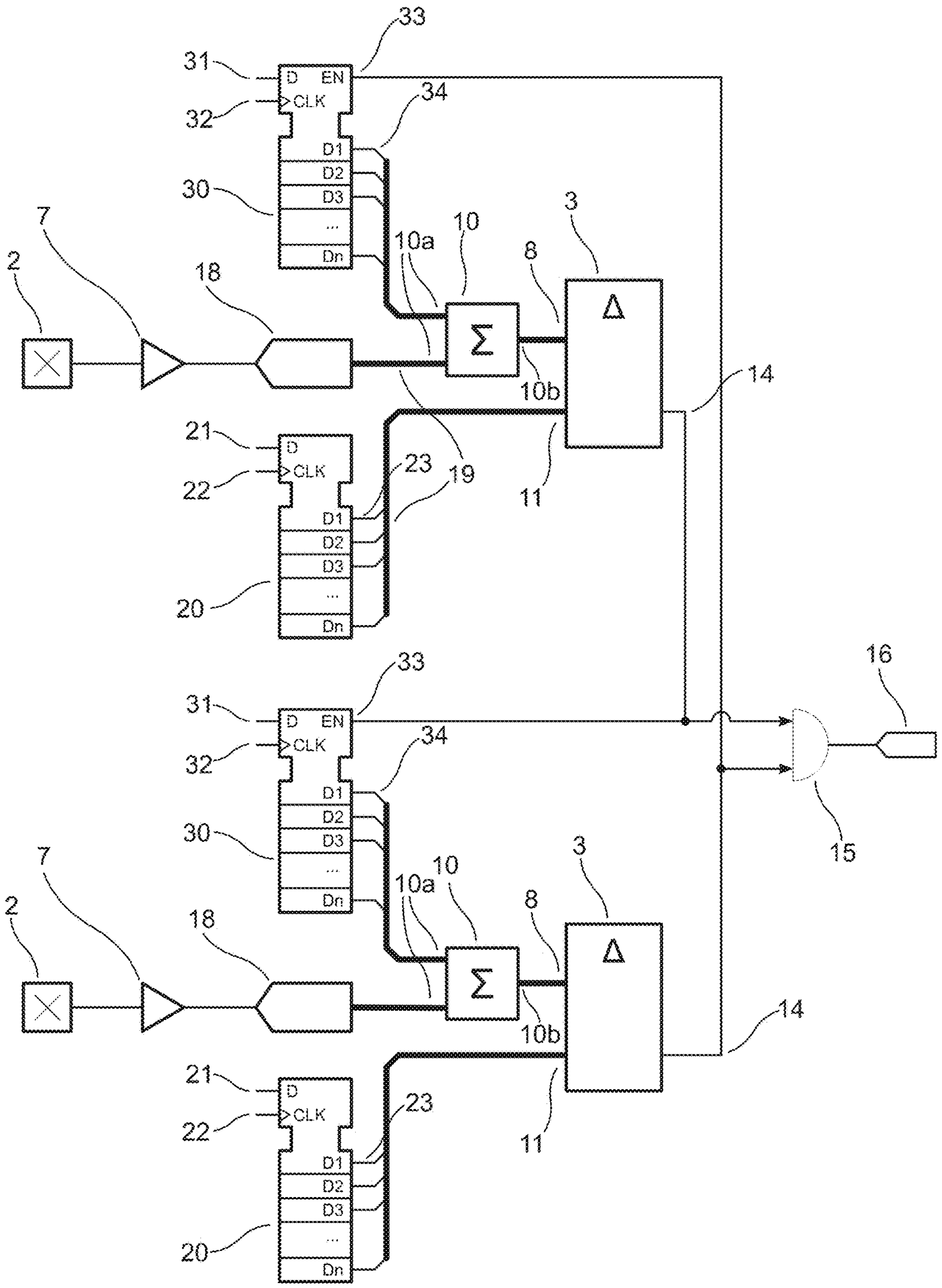
FIG. 5 shows a sensor unit in digital design.

FIG. 5 shows a digital example of the sensor circuit 1 according to the invention. The analog measurement signals of the two redundant sensors 2 of the sensor circuit are scaled by respective scalers 7 and then digitized by a respective analog-to-digital converter 18.

The analog-to-digital converters 18 may also be integrated in the respective sensors 2, so that the sensors 2 already provide a digital output signal. Furthermore, the scaling may also be implemented internally in the sensor, so that the scalers 7 may be dispensed with if necessary. In particular, sensors 2 with certain measuring ranges may also simply be selected to define the scaling factors without providing scalers 7.

The digitized measurement signals are fed by means of data lines 19 via a respective summer or adder 10 for the addition of a bias value (see below) to a measuring input 8 of a comparison circuit 3, which is designed as a subtractor.

Reference inputs 11 of the comparison circuits 3 receive digitally coded reference signals (by the binary numbers D1 to Dn) from data outputs 34 of a respective reference value register 30, which define the respective trigger threshold value 9 of the comparison circuits.

The comparison circuits 3 calculate the difference between the respective measurement signal and the respective reference signal and output a binary signal at the comparison circuit output 14, which in particular has the value 0 if the difference between the measurement signal and the reference signal is less than zero and has the value 1 if the difference is greater than zero.

A linking unit 15, which is formed as a digital AND gate, links the comparison circuit output signals of the comparison circuits 3 by means of a logical AND operation and outputs a corresponding binary circuit output signal 16 having a value of 1 when both comparison circuits 3 output the comparison circuit output value representing a difference greater than zero.

The trigger threshold value stored in the reference value register 20 may be changed by applying a data signal to the data input 21 and a clock signal to the clock input 22 of the reference value register 20. In particular, the individual bits D1 to Dn of the reference value register 20 receive data signals in known manner one after the other in a sequence predetermined by the clock signal, the level of which is assigned the value 0 or the value 1. In particular, this step is already carried out when the sensor circuit 1 is put into operation, which facilitates data synchronization during subsequent operation.

In order to implement the feedback according to the invention, the comparison circuit outputs 14 of the comparison circuits 3 are additionally connected to an enable input 33 of the bias register 30, which is assigned to the respective other sensor 2.

The bias register 30 stores a bias value in digitally encoded form. In the same way as for the reference value register 20, this bias value may be changed by applying a data signal to a data input 31 and applying a clock signal to the clock input 32 of the bias register 30.

If a signal representing the value or logic state 1 is applied to the enable input 33 of the respective bias register 30, the bias value is routed via the data outputs 34 to an input 10*a* of the respective summer 10 and added to the digitized measurement signal of the respective sensor 2. The enable input 33 thus controls in particular only the output of the stored bias value, but not the overwriting of the stored bias value via the data input 31.

By activating the enable input due to the feedback according to the invention, the difference between the measurement input 8 and the reference input 11 is reduced or the sign of this difference is reversed. In this way, the temporal response of the sensors 2 can be synchronized while maintaining their independence.

Of course, the bias value may also be a negative number, which then results in a lower output value of the summer 10 compared to the value of the measurement signal of the sensor 2.

Furthermore, as an alternative to the embodiment shown in FIG. 5, the output signal of the reference value register 20 can also be linked to the output signal of the bias register 30 via a summer 10 or adder in order to achieve an adjustment of the reference signal via feedback.

The data lines 19 of the digital sensor circuit 1 shown in FIG. 5 may in particular be a data bus. Alternatively, the entire sensor circuit 1 or parts thereof may also be integrated on a circuit, e.g., on a microcontroller, a so-called field programmable gate array (FPGA) or a so-called application specific integrated circuit (ASIC).

Figure 6:
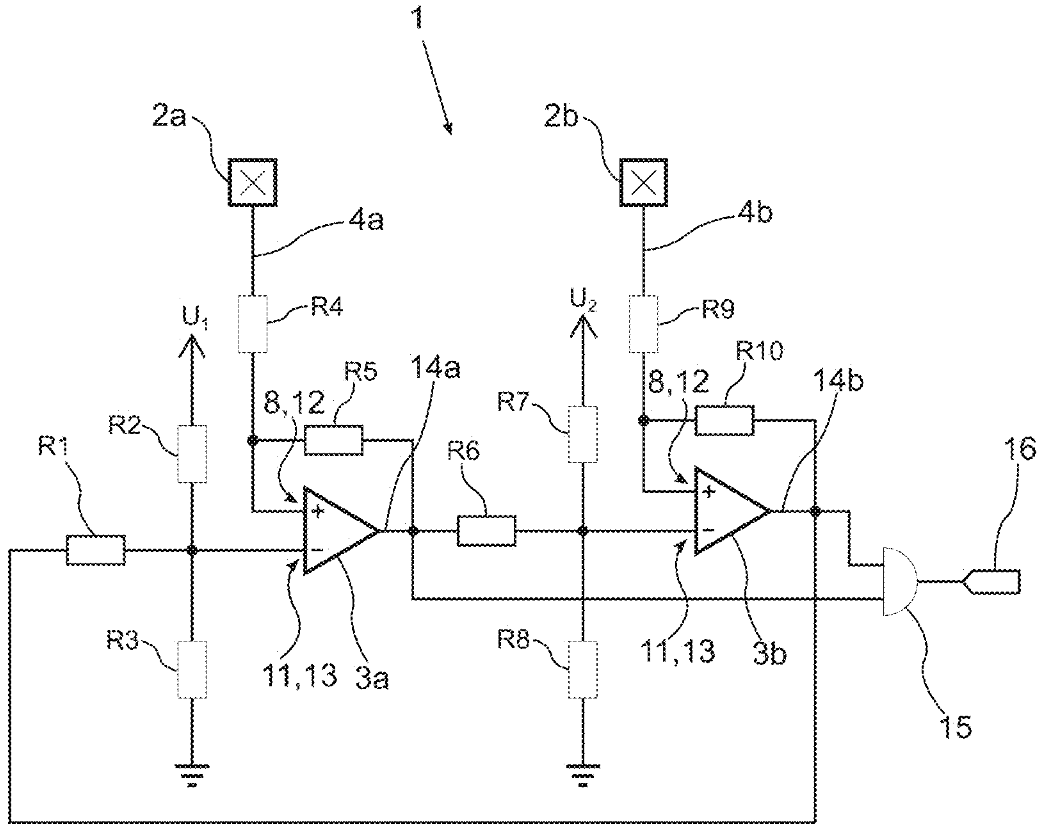
FIG. 6 shows the circuit diagram of an analog sensor circuit according to the invention.

FIG. 6 shows an analogous example of the sensor circuit 1 according to the invention, in which the trigger threshold values are preset or adjustable by electrical resistors.

The redundant sensors 2*a*, 2*b* are connected via resistors R4 and R9 respectively to the measurement value inputs 8 of the comparison circuits 3*a*, 3*b*, which are designed as comparators.

The resistors R2 and R3 as well as R7 and R8 each form a voltage divider. The reference voltages $U_1$ and $U_2$ can be used to set the trigger threshold value for the respective comparison circuit 3*a*.

The comparison circuit outputs 14*a*, 14*b* of the comparison circuits 3*a*, 3*b* are connected to the reference input 11 (here an inverting input 13) of the respective other comparison circuit 3*a*, 3*b* via resistors R1 and R6, respectively, so that the corresponding comparison circuit output values 17 are fed back to the respective reference inputs 11. The scaling factor of the feedback can be determined by selecting or setting the resistors R1 and R6.

The logic states of the comparison circuit outputs 14*a*, 14*b* are combined in the linking unit 15 with a logic AND operation, and the linking unit 15 outputs a sensor output value 16 representing the logic state obtained by the AND operation.

Finally, the sensors 2*a*, 2*b* are each directly connected to the linking unit 15 via the additional resistors R5, R10, which results in a hysteresis of the switching operation. In other words, the resistors R5, R10 cause the trigger threshold value of each sensor to differ at least slightly between a switch-on operation (switching from logic state L=0 to logic state L=1) and a switch-off operation (switching from logic state L=1 to logic state L=0). For example, a slightly lower trigger threshold value may be provided for a switch-on operation than for a switch-off operation.

Figure 7:
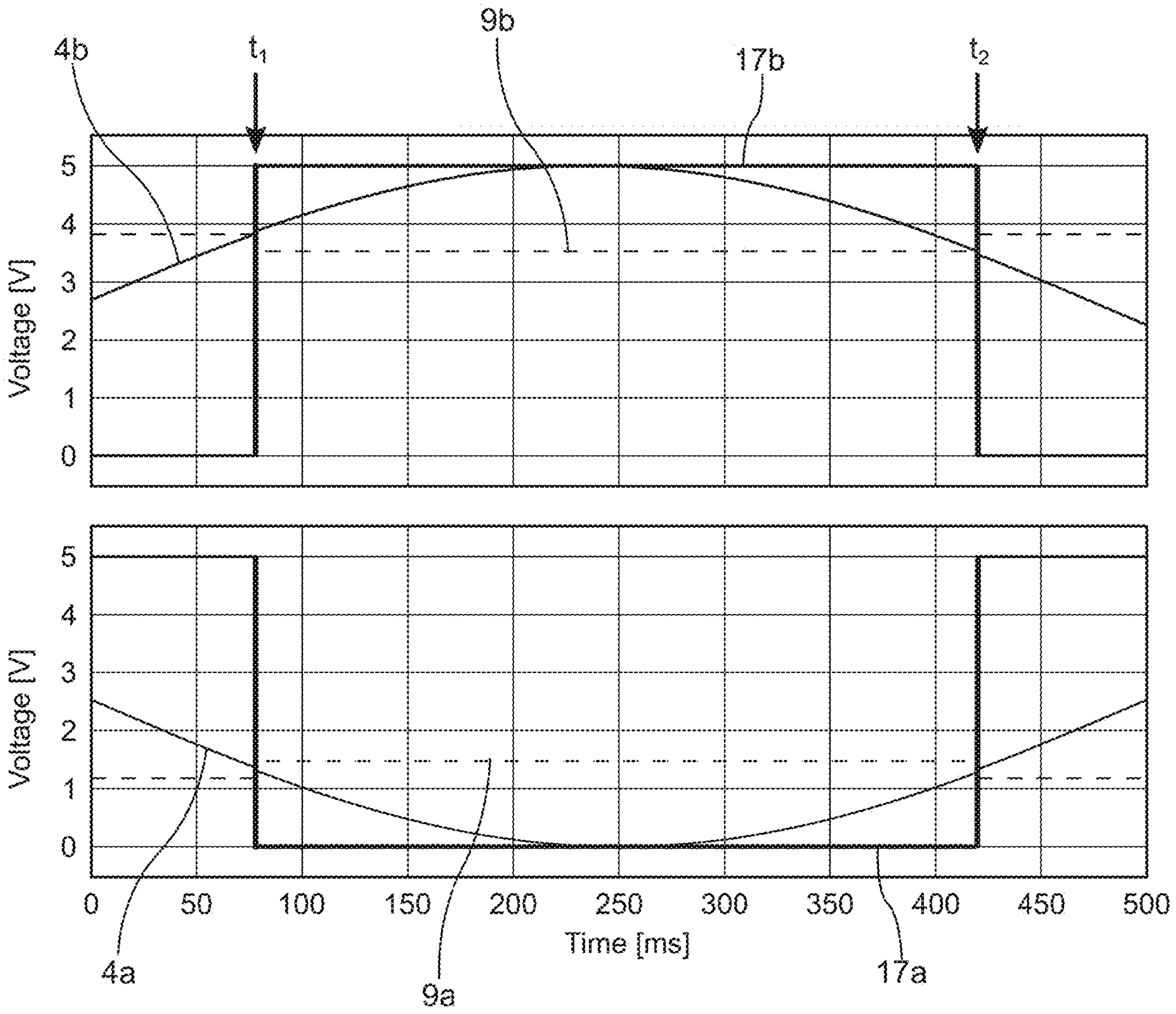
FIG. 7 shows the simulation of a sensor circuit according to the invention.

FIG. 7 shows a simulation result of a sensor circuit 1 according to the invention, which can be used, example. g., to monitor the opening state of a shielding element 40, such as a housing cover (see FIG. 8). For this purpose, when the cover is closed, a permanent magnet is inserted or pivoted into a gap between two Hall sensors 2*a*, 2*b* arranged opposite each other; when the device cover is opened, the magnet is pulled out of the gap or pivoted out.

When the cover is open (i.e. when the magnet is pivoted out), the Hall sensors 2*a*, 2*b* output a quiescent voltage of 2.5 V as a measurement value which, depending on the pole of the magnet facing the sensor 2*a*, 2*b*, drops to 0 V (sensor 2*a*) or rises to the operating voltage VCC=5 V (sensor 2*b*) when the cover is closed (i.e. when the magnet is pivoted in). Sensors 2*a*, 2*b* thus have antivalent signal levels.

The simulation of the sensor circuit was based on the circuit diagram shown in FIG. 6 and simulated with the circuit simulation software Ngspice version 33.

Resistors R2 and R3 were used to set the trigger threshold value to approximately 1.3 V for comparison circuit 3*a* and approximately 3.8 V for comparison circuit 3*b*, both relative to the quiescent state.

FIG. 7 shows time-voltage curves for the first sensor 2*a* and the first comparison circuit 3*a* (lower diagram) and for the second sensor and the second comparison circuit 3*b* (upper diagram). The solid curves represent the time course of the measurement values 4*a*, 4*b* of the sensors 2*a*, 2*b*. The dashed lines represent the time course of the trigger threshold values 9*a*, 9*b* of the comparison circuits 3*a*, 3*b*. Finally, the time course of the comparison circuit output values 17*a*, 17*b* is shown.

The comparison circuit output value 17*a* 5V of the first comparison circuit 3*a* represents the logic state L=0 and the comparison circuit output value 17*a* 0V represents the logic state L=1. Conversely, the comparison circuit output value 17*b* 0V of the second comparison circuit 3*b* represents the logic state L=0 and the comparison circuit output value 17*b* 5V represents the logic state L=1.

The measurement value 4*a* of the first sensor drops continuously from an initial value of 2.5 V to 0V within 250 ms and then rises continuously again to 2.5 V within the same time. Such a behavior could result, e.g., from rapid closing and subsequent reopening of a housing cover whose opening state is monitored by a Hall sensor. Accordingly, the measurement value 4*b* of the antivalent sensor 2*b* (upper diagram) rises from 2.5 V to 5 V within 250 ms and falls back to 2.5 V within the same time.

At the first triggering time $t_1$, the measurement value 4*b* of the second sensor 2*b* exceeds the predetermined trigger threshold value 9*b*. This causes the second comparison circuit 3*b* to switch to the logic state L=1 represented by the comparison circuit output value 17*b* of 5V. As a result, the comparison circuit output value 17*b* increases abruptly from 0 V to 5 V at the time $t_1$ (or correspondingly later depending on the delay of the comparison circuit).

The switching of the second comparison circuit 3*b* causes the scaled comparison circuit output value 17*b* to be fed back to the measurement input 8 or reference input 11 of the first comparison circuit 3*a*, thus raising the first trigger threshold value 9*a* (see lower diagram).

The measurement value 4*a* of the first sensor 2*a* was still just above the initially set trigger threshold 9*a* at the first triggering time $t_1$. However, due to the feedback of the other switching signal, the trigger threshold value 9*a* exceeds the measurement value 4*a* shortly after the first triggering time $t_1$. Thus, a sign change of the difference between the measurement value 4*a* and the trigger threshold value 9*a* is brought about, which leads to a switching of the first comparison circuit 3*a*.

The switching of the first comparison circuit 3*a* also leads to a reduction in the trigger threshold value 9*b* of the second comparison circuit 3*b* due to feedback. However, since it has already switched to the L=1 state, this does not cause any further change at the first triggering time $t_1$.

At the second triggering time $t_2$, the measurement value 4*b* of the second sensor 2*b* again reaches the trigger threshold value 9*b*, while the measurement value 4*a* of the first sensor 2*a* is still below its trigger threshold value 9*a*. Thus, initially only the second comparison circuit 3*b* switches back to the logic state L=0. However, the trigger threshold value 9*a* of the first comparison circuit 3*a* is reduced by the feedback, which again results in a sign change of the difference between the measurement value 4*a* and the trigger threshold value 9*a*. As a result, the first comparison circuit 3*a* also switches to the logic state L=1.

Thus, it can be seen from the simulation how the sensor circuit 1 according to the invention may be used to synchronize the triggering timing of the redundant sensors 2*a*, 2*b* while maintaining the independence of the sensors 2*a*, 2*b*.

FIG. 8 shows various views of an exemplary device 100 with a sensor circuit 1 according to the present invention. Here, FIG. 8A and FIG. 8B are side views of the device 100 in different states. FIG. 8C and FIG. 8D show a detail of the device 1 in different states.

The device 100 comprises a housing 41 that at least partially encloses internal components (not shown) of the device 100. A shielding element 40, such as a cover, is pivotally connected to the housing 41 via a pivotal connection 42. In the state shown in FIG. 8B, the shielding element 40 covers the internal components.

The internal components may be, e.g., moving mechanical parts such as shafts, gears, and the like. In this case, the shielding element 40 in the state shown in FIG. 8B functions to protect a user from being injured by the mechanical parts during operation of the device 100.

Alternatively, the device 100 may be a laser device that includes as an internal component a laser or a beam path into which laser light is coupled from an external source. Then, in the state shown in FIG. 8B, the shielding element 40 prevents laser light from exiting the device 100, thereby preventing potential eye damage to a user.

The device 100 further comprises a first sensor 2*a* and a second sensor 2*b* (see FIG. 8C and FIG. 8D), which monitor the state of the shielding element 40 in a redundant manner. According to the example shown in FIG. 8, the sensors 2*a*, 2*b* are magnetic field sensors, e.g., Hall sensors. The sensors 2*a*, 2*b* are arranged on both sides of a shaft 44 in the housing 41 and are connected to a sensor circuit 1 according to the invention so that, depending on the magnetic field acting in the Zo shaft 44, measurement signals can be transmitted to the previously described components of the sensor circuit 1.

Figure 8A:
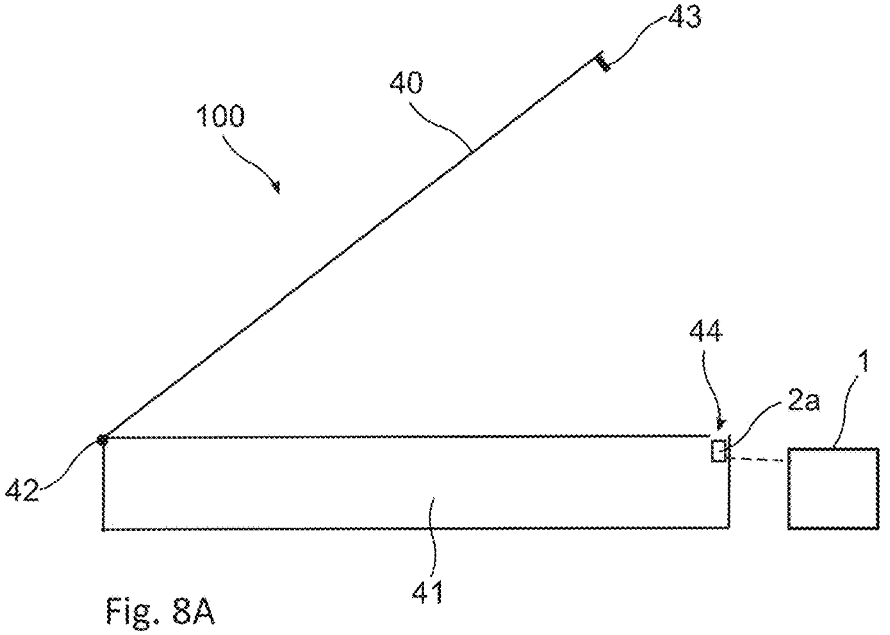
FIG. 8A-D shows a device with a sensor circuit according to the invention.
Figure 8B:
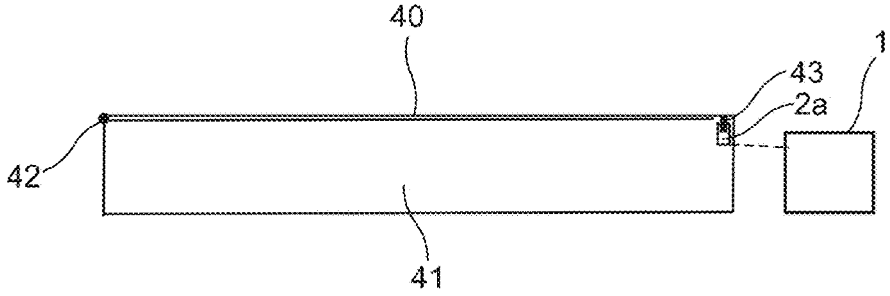
Figure 8C:
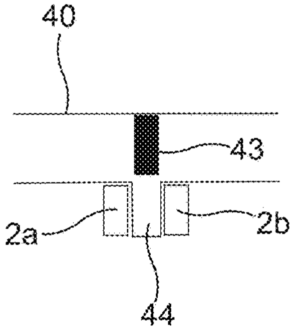
Figure 8D:
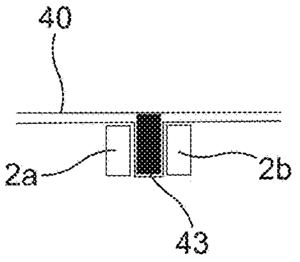

A magnet 43 is connected to the shielding element 40, which is arranged in the shaft 44 in the state of the shielding element 40 shown in FIG. 8B and FIG. 8D but is positioned outside the shaft 44 in the state shown in FIG. 8A and FIG. 8C. Thus, depending on the state of the shielding element 40, a magnetic field of different strength acts in the shaft 44, which can be measured by the sensors 2*a*, 2*b*.

If the sensor circuit 1 detects by evaluating the measurement signals from the sensors 2*a*, 2*b* that the shielding element 40 is in a state in which there is insufficient protection for the user (FIG. 8A, FIG. 8C), a warning message may be issued, for example, and/or an emergency shutdown of the device 100 or a transition to a safe state may be initiated automatically. In particular, this means that the moving mechanical components in the device 100 are brought to a standstill or that the laser light is switched off, shielded or redirected.

LIST OF REFERENCE SIGNS

1 Sensor circuit
2 Sensor
2*a* First sensor
2*b* Second sensor
3 Comparison circuit
3*a* First comparison circuit
3*b* Second comparison circuit
4 Measurement value
4*a* First measurement value
4*b* Second measurement value
5 Driver
6 Gain factor
7 Scaler
8 Measurement input
9 Trigger threshold value
9*a* First trigger threshold value
9*b* Second trigger threshold value
10 Summer
10*a* Input
10*b* Output
11 Reference input
12 Non-inverting input
13 Inverting input
14 Comparison circuit output
14*a* First comparison circuit output
14*b* Second comparison circuit output
15 Linking unit
16 Circuit output signal
17 Comparison circuit output value

17*a* First comparison circuit output value
17*b* Second comparison circuit output value
18 Analog-to-digital converter
19 Data line
20 Reference value register
21 Data input
22 Clock input
23 Data output
30 Bias Register
31 Data input
32 Clock input
33 Enable input
34 Data output
40 Shielding element
41 Housing
42 Pivotal connection
43 Magnet
44 Shaft
50 Error detection unit
51 Error signal
100 Device
$t_1$ First triggering time
$t_2$ Second triggering time
$U_1$ First reference voltage
$U_2$ Second reference voltage

The invention claimed is:

1. A sensor circuit for a device performing a safety function comprising at least two sensors, wherein each of the sensors is configured to detect a respective measured variable and to generate a measurement signal comprising a measurement value which is monotonically dependent on the respective measured variable, at least two comparison circuits, wherein each of the comparison circuits is assigned to one of the sensors and comprises a measurement input for receiving the measurement signal of the respective assigned sensor, a reference input for receiving a reference signal to define a trigger threshold value of the comparison circuit, and a comparison circuit output, wherein the comparison circuit output can assume a first logic state and a second logic state, and wherein the comparison circuit output is configured to generate a comparison circuit output signal comprising a comparison circuit output value representing one of the logic states, a linking unit which is configured to combine the logic states of the comparison circuit outputs by means of a logic AND operation to form a circuit output signal of the sensor circuit, wherein the sensor circuit is configured to scale the comparison circuit output value of at least a first one of the comparison circuits and to feed back the comparison circuit output value to the measurement input or the reference input of at least a second one of the comparison circuits, so that, when the comparison circuit output of the first comparison circuit transitions between the logic states, the difference between the measurement signal and the reference signal of the second comparison circuit is reduced or the sign of the difference between the measurement signal and the reference signal of the second comparison circuit is reversed.

2. The sensor circuit according to claim 1, wherein the sensor circuit is configured to scale the comparison circuit output value of the first comparison circuit with a factor of <0.5.

3. The sensor circuit according to claim 1, wherein the sensor circuit is configured to generate the reference signal of the second comparison circuit by a weighted sum of the trigger threshold value of the second comparison circuit and the comparison circuit output value of the first comparison circuit weighted by a weighting factor and optionally the comparison circuit output value of a further one of the comparison circuits weighted by a weighting factor, and/or in that the sensor circuit is configured to generate the measurement signal of the second comparison circuit by a weighted sum of the measurement signal of the sensor assigned to the second comparison circuit and the comparison circuit output value of the first comparison circuit weighted by a weighting factor and optionally the comparison circuit output value of at least a further one of the comparison circuits weighted by a weighting factor.

4. The sensor circuit according to claim 3, wherein the weighting factor used in generating the reference signal from the weighted sum is less than or equal to zero or the weighting factor used in generating the measurement signal from the weighted sum is larger than or equal to zero if the comparison circuit output value of the first comparison circuit is smaller in the first logic state than in the second logic state and the measurement value of the sensor assigned to the second comparison circuit increases monotonically as a function of the measured variable or if the comparison circuit output value of the first comparison circuit is greater in the first logic state than in the second logic state and the measurement value of the sensor assigned to the second comparison circuit falls monotonically as a function of the measured variable.

5. The sensor circuit according to claim 3, wherein the weighting factor used in generating the reference signal from the weighted sum is greater than or equal to zero or the weighting factor used in generating the measurement signal by the weighted sum is smaller than or equal to zero, if the comparison circuit output value of the first comparison circuit is larger in the first logic state than in the second logic state and the measurement value of the sensor assigned to the second comparison circuit increases monotonically as a function of the measured variable or if the comparison circuit output value of the first comparison circuit is smaller in the first logic state than in the second logic state and the measurement value of the sensor assigned to the second comparison circuit falls monotonically as a function of the measured variable.

6. The sensor circuit according to claim 1, wherein the first logic state and the second logic state are represented by electrical signal levels.

7. The sensor circuit according to claim 1, wherein the first logic state and the second logic state are represented by optical signal states.

8. The sensor circuit according to claim 6, wherein logically identical logic states of the comparison circuit outputs of different ones of the comparison circuits are represented by different signal levels or optical signal states.

9. The sensor circuit according to claim 1, wherein the measurement values are represented by analog voltage or current values.

10. The sensor circuit according to claim 1, wherein the measurement values are represented by numbers in a binary representation.

11. The sensor circuit according to claim 1, wherein the measured variables are independently selected from the group: mechanical displacement, mechanical force, pressure, light intensity, polarization, temperature, loudness, capacitance, inductance, magnetic flux, electric voltage, electric current or electric field strength.

12. The sensor circuit according to claim 1, wherein the sensors are independently selected from the group: hall sensors, photodiodes, phototransistors, photoresistors, thermocouples, capacitive or inductive distance sensors, strain gauges, microphones, adjustable resistors, adjustable capacitors, adjustable inductors.

13. The sensor circuit according to claim 1, wherein the sensors are configured to detect different measurement variables.

14. The sensor circuit according to claim 1, wherein the sensors are configured to detect the same measurement variable, but are based on different measuring principles or are different sensor types.

15. The sensor circuit according to claim 1, wherein the sensor circuit comprises a fault detection unit, wherein the fault detection unit is configured to link the logic states of the comparison circuit outputs by means of a logic exclusive-OR operation to form a fault signal of the sensor circuit.

16. A device for performing a safety function comprising a sensor circuit according to claim 1.

17. The device according to claim 16, wherein the device is a machine comprising a shielding element for protecting against contact of electrically, pneumatically or hydraulically driven elements, and wherein the sensor circuit is configured to monitor a state of the shielding element.

18. The device according to claim 16, wherein the device is a laser device, and wherein the laser device comprises a laser of laser class 3, 3B, 3R or 4 and a shielding element for protection against laser radiation escaping from the laser device and/or an optical element that can be moved into various adjustment positions, and wherein the sensor circuit is configured to monitor a state of the shielding element or the movable optical element.

19. A light microscope comprising a sensor circuit according to claim 1.

20. A method for processing measurement values from sensors for a device performing a safety function, comprising the steps of detecting a respective measured variable and generating a respective measurement signal comprising a measurement value which is monotonically dependent on the respective measured variable by means of at least two sensors, receiving the measurement signals by respective measurement inputs of at least two comparison circuits, each of the comparison circuits being associated with one of the sensors, receiving reference signals for setting a trigger threshold value by respective reference inputs of the comparison circuits, outputting comparison circuit output signals by respective comparison circuit outputs of said comparison circuits, said comparison circuit outputs each being capable of assuming a first logic state and a second logic state, said comparison circuit output signals each comprising a comparison circuit output value representing one of said logic states, combining the logic states of the comparison circuit outputs to a circuit output signal by means of a logical AND operation, scaling the comparison circuit output value of at least a first one of the comparison circuits and feeding it back to the measurement input or the reference input of at least a second one of the comparison circuits, so that during the transition of the comparison circuit output of the first comparison circuit between the logic states, the difference between the measurement signal and the reference signal of the second comparison circuit is reduced or the sign of the difference between the measurement signal and the reference signal of the second comparison circuit is reversed.

* * * * *